(12) United States Patent
Stelle, IV et al.

(10) Patent No.: US 6,486,718 B1
(45) Date of Patent: Nov. 26, 2002

(54) MICROPROCESSOR SELF-POWER DOWN CIRCUIT

(75) Inventors: Raleigh B. Stelle, IV, Indianapolis, IN (US); John S. Holmes, II, Sellersburg, IN (US)

(73) Assignee: Roche Diagnostics Corporation, Indianapolis, IN (US)

( * ) Notice: Subject to any disclaimer, the term of this patent is extended or adjusted under 35 U.S.C. 154(b) by 0 days.

(21) Appl. No.: 09/862,131

(22) Filed: May 21, 2001

(51) Int. Cl.[7] ............................................... H03K 17/22
(52) U.S. Cl. ....................... 327/198; 327/143; 327/398; 327/394
(58) Field of Search ................................. 327/143, 198, 327/392, 394, 398

(56) References Cited

U.S. PATENT DOCUMENTS

| | | | |
|---|---|---|---|
| 3,559,072 A | * | 1/1971 | Davisson ...................... 327/394 |
| 3,810,203 A | * | 5/1974 | Mori et al. .................. 396/230 |
| 3,879,137 A | * | 4/1975 | Sakazaki et al. ............ 327/398 |
| 4,269,496 A | * | 5/1981 | Motoori et al. ............. 327/143 |
| 4,274,034 A | * | 6/1981 | Conklin ....................... 123/653 |
| 4,538,074 A | * | 8/1985 | Fraden ........................ 307/126 |
| 4,698,530 A | | 10/1987 | Thomson |
| 4,713,555 A | | 12/1987 | Lee |
| 4,868,832 A | | 9/1989 | Marrington et al. |
| 4,951,171 A | | 8/1990 | Tran et al. |
| 4,963,814 A | | 10/1990 | Parks et al. |
| 5,010,469 A | | 4/1991 | Bobry |
| 5,117,324 A | | 5/1992 | Johnson, Jr. |
| 5,341,034 A | | 8/1994 | Matthews |
| 5,543,741 A | * | 8/1996 | Purits ......................... 327/142 |
| 5,594,906 A | | 1/1997 | Holmes, II et al. |
| 5,792,944 A | | 8/1998 | Lennert et al. |

OTHER PUBLICATIONS

"Optimize Microprocessor Supervisory Circuits",Len Sherman and Doug Vargha, Electronic Design, Sep. 5, 1994, pp. 67–76.

* cited by examiner

*Primary Examiner*—Terry D. Cunningham
(74) *Attorney, Agent, or Firm*—Barnes & Thornburg

(57) ABSTRACT

A self-power down circuit for a controller coupled to a battery to obtain power from the battery. The controller has a port, the state of which changes during powering up of the controller. The circuit includes a first switching device including a main current conducting path and a control terminal. The control terminal of the first switching device is coupled to the port for monitoring the state of the port. The circuit further includes a second switching device including a main current conducting path and a control terminal, and a switch. The port is coupled to the battery through the main current conducting path of the second switching device. The control terminal of the second switching device is coupled to the switch for actuation by actuation of the switch. The control terminal of the second switching device is also coupled to the main current conducting paths of the first and second switching devices through first and second voltage dropping elements, respectively.

11 Claims, 1 Drawing Sheet

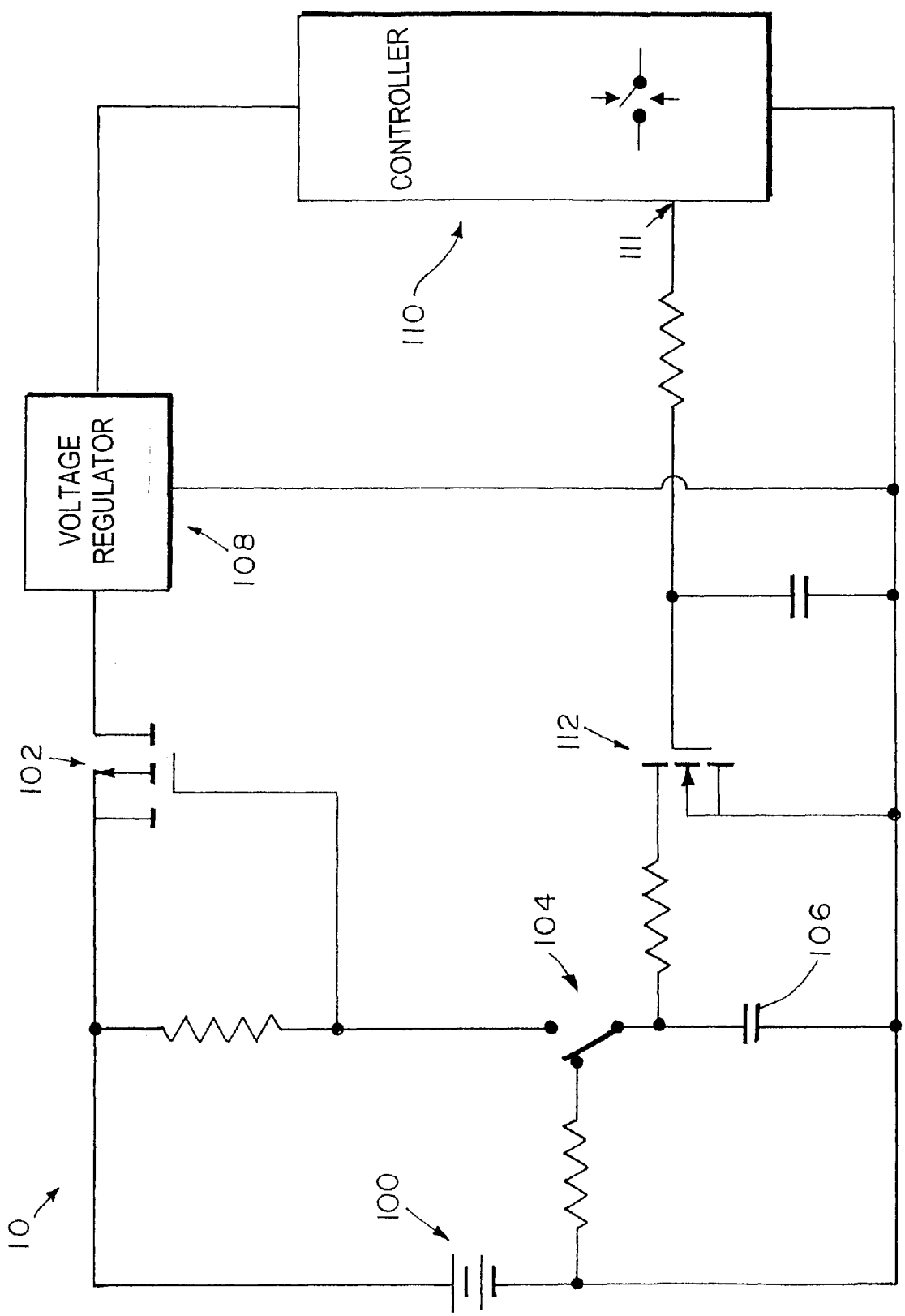

MICROPROCESSOR SELF-POWER DOWN CIRCUIT

FIELD OF THE INVENTION

This invention relates to circuits for controlling the powering down of microcontroller-, microprocessor-, and microcomputer-controlled instruments.

BACKGROUND OF THE INVENTION

Several systems for regulating or controlling the supply of power to microcontrollers, microprocessors and microcomputers, sometimes collectively referred to hereinafter as μCs, and other types of circuits in instruments for monitoring or testing the concentrations of medically significant components of body fluids and the like. Such systems are illustrated in, for example, U.S. Pat. Nos. 4,698,530; 4,713,555; 4,868,832; 4,951,171; 4,963,814; 5,010,469; 5,117,324; 5,341,034; 5,594,906; and, 5,792,944. There are also the systems described in Sherman, Len and Doug Vargha, "Optimize Microprocessor Supervisory Circuits," *Electronic Design*, vol. 42, no. 18, 1994, pp. 67–76. No representation is intended that a complete search has been made of the prior art or that no better art references than those listed here exist, nor should any such representation be inferred. This listing shall not be construed to be an admission that the listed references are, or are considered to be, material to patentability, nor should any such admission be inferred.

μCs that have power down modes typically draw a small amount of current when they are powered down. The lifetimes of batteries in battery operated devices of this type are compromised by this current drain during times of inactivity. Three commonly employed techniques for reducing the current drain on a battery during times of inactivity in this type of application are: the use of a toggle switch only, which requires the operator to turn the circuit off in order to be effective; the use of the μC power down mode, which consumes power, thus reducing the life of a battery used to power the instrument; and, the use of a power supervisor circuit which also consumes power, thus reducing battery life.

DISCLOSURE OF THE INVENTION

According to the invention, a self-power down circuit is provided for a circuit including a battery and a controller coupled to the battery to obtain power from the battery. The controller has a port, the state of which changes during powering up of the controller. The circuit includes a first switching device including a main current conducting path and a control terminal. The control terminal of the first switching device is coupled to the port for monitoring the state of the port. The circuit further includes a second switching device including a main current conducting path and a control terminal, and a switch. The port is coupled to the battery through the main current conducting path of the second switching device. The control terminal of the second switching device is coupled to the switch for actuation by actuation of the switch. The control terminal of the second switching device is also coupled to the main current conducting paths of the first and second switching devices through first and second voltage dropping elements, respectively.

Illustratively according to the invention, the first switching device includes a first field effect transistor (FET). The main current conducting path of first FET includes its drain and source terminals. The control terminal of the first FET is its gate terminal.

Further illustratively according to the invention, the main current conducting path of the first FET is coupled to a first terminal of the switch. A second terminal of the switch is coupled to the control terminal of the second switching device.

Additionally illustratively according to the invention, the main current conducting path of the first FET is coupled through the first voltage dropping element to the first terminal of the switch.

Illustratively according to the invention, the first voltage dropping element includes a first voltage dropping element resistor.

Illustratively according to the invention, the second switching device includes a second FET. The main current conducting path of the second FET includes its drain and source terminals. The control terminal of the second FET is its gate terminal.

Further illustratively according to the invention, the second voltage dropping element includes a second voltage dropping element resistor. The gate of the second FET is coupled through the second voltage dropping element resistor to one of the source and drain of the first FET.

Additionally illustratively according to the invention, the main current conducting path of the first FET is coupled to a first terminal of the switch. A second terminal of the switch is coupled to the gate of the second FET.

Illustratively according to the invention, the main current conducting path of the first FET is coupled through the first voltage dropping element to the first terminal of the switch.

Illustratively according to the invention, the port is coupled through a software switch, a voltage regulator and the main current conducting path of the second switching device to the battery.

Further illustratively according to the invention, the port includes a port of one of a microcontroller, microprocessor or microcomputer.

BRIEF DESCRIPTION OF THE DRAWING

The invention may best be understood by referring to the following detailed description and the accompanying drawing which illustrates the invention. The drawing illustrates a partly block and partly schematic diagram of a circuit incorporating the invention.

DETAILED DESCRIPTION OF AN ILLUSTRATIVE EMBODIMENT

In the description that follows, a circuit schematic and block diagram is described. Specific components, specific sources, and in some cases, specific terminal, pin and port names and numbers of those components will be provided. However, it is to be understood that other components capable of performing equivalent functions to those specifically identified components may be available from the same, or different, sources, and that the various terminals, pins and ports of any such equivalent components may have different names and numbers. Thus, this invention is not limited to the specifically identified components or the specifically identified sources.

The circuit of the present invention removes all power from the μC, under software control, such that the standby current is below the level of practical measurement. This circuit utilizes a series enhancement mode metal oxide semiconductor field effect transistor, or MOSFET, hereinafter more simply abbreviated FET, that breaks the path of power supply current to the voltage regulator. This is initialized by a toggle switch. If the user leaves the circuit active for a period of time, determined in the $\mu$C software, the microcontroller can break the circuit by activating a second FET which controls the gate of the first FET. The circuit must then be reset by deactivating the toggle switch.

Referring now to the FIGURE, an instrument 10 of the type described above is powered from a battery 100, for example, a 9V battery. The drain of an FET 102 is coupled to one terminal of battery 100. FET 102 illustratively is a type BSS110FET. The other terminal of battery 100 is coupled to the instrument 10 common, or ground. The gate of FET 102 is coupled through a 1 M$\Omega$ resistor to its drain. The gate of FET 102 is also coupled to the pole of a SPDT on/off switch 104. One throw of switch 104 is coupled through a 0.1 $\mu$F capacitor 106 to ground. The other throw of switch 104 is coupled through a 100 $\Omega$ resistor to ground. The source of FET 102 is coupled to an input terminal of a voltage regulator integrated circuit (IC) 108, the output terminal of which is coupled to the power supply terminal, for example, the VDD terminal, of a $\mu$C 110 to supply operating voltage to the $\mu$C 110. IC 108 illustratively is a type 78L05 voltage regulator IC and $\mu$C 110 illustratively is a 5V type 8051 $\mu$C. In the illustrative example, a port 111 other than port 0 of $\mu$C 110 is coupled through a 1 K$\Omega$ resistor to the gate of an FET 112. The gate of FET 112 is also coupled to ground through a 1 $\mu$F capacitor. The drain of FET 112 is coupled through a 100 $\Omega$ resistor to the common terminal of switch 104 and capacitor 106. The source of FET 112 is coupled to ground. FET 112 illustratively is a type BSS98FET.

In operation, if it is first assumed that the instrument 10 is off, switch 104 is operated to activate the instrument 10. The gate of FET 102 is coupled through capacitor 106 to ground. As a result, the potential on the gate of FET 102 is pulled negative with respect to its source, and FET 102 is rendered conductive. Voltage is supplied from battery 100 via FET 102 and voltage regulator 108 to $\mu$C 110. $\mu$C 110 is turned on, and its port P is raised to a positive potential. This positive potential is coupled to the gate of FET 112, rendering FET 112 conductive. This results in capacitor 106 being discharged, conditioning the instrument 10 for the next turn-on cycle. It further results in FET 102 being held in conduction. When $\mu$C 110 times out under software control, port P is returned to a potential that will not hold FET 112 in conduction. As a result, the gate of FET 102 is returned to its source potential, and FET 102 is rendered non-conductive, removing the VDD operating potential from $\mu$C 110. The circuit is turned off. Of course, it should be recognized that throwing switch 104 to the "off" position illustrated in the Figure will also result in the instrument 10 being turned off.

What is claimed is:

1. A self-power down circuit for a circuit including a battery and a controller coupled to the battery to obtain power from the battery, the self-power down circuit including a port of the controller, the port changing state during initialization and power-down of the controller, a first switching device including a main current conducting path and a control terminal, the control terminal coupled to the port for monitoring the state of the port, a second switching device including a main current conducting path and a control terminal, and a switch, the port being coupled to the battery through the main current conducting path of the second switching device, the control terminal of the second switching device being coupled to the switch for actuation by actuation of the switch, the control terminal of the second switching device also coupled to the main current conducting paths of the first and second switching devices through first and second voltage dropping elements, respectively, the first switching device including a first field effect transistor (FET), the main current conducting path of which includes the first FET's drain and source terminals, and the control terminal of which is the first FET's gate terminal, the main current conducting path of the first FET being coupled to a first terminal of the switch, a second terminal of the switch being coupled to the control terminal of the second switching device.

2. The self-power down circuit of claim 1 wherein the main current conducting path of the first FET is coupled through the first voltage dropping element to the first terminal of the switch.

3. The self-power down circuit of claim 2 wherein the first voltage dropping element includes a first voltage dropping element resistor.

4. The self-power down circuit of claim 1 wherein the port is coupled through a software switch, a voltage regulator and the main current conducting path of the second switching device to the battery.

5. The self-power down circuit of claim 2 wherein the port is coupled through a software switch, a voltage regulator and the main current conducting path of the second switching device to the battery.

6. The self-power down circuit of claim 3 wherein the port is coupled through a software switch, a voltage regulator and the main current conducting path of the second switching device to the battery.

7. A self-power down circuit for a circuit including a battery and a controller coupled to the battery to obtain power from the battery, the self-power down circuit including a port of the controller, the port changing state during initialization and power-down of the controller, a first switching device including a main current conducting path and a control terminal, the control terminal coupled to the port for monitoring the state of the port, a second switching device including a main current conducting path and a control terminal, and a switch, the port being coupled to the battery through the main current conducting path of the second switching device, the control terminal of the second switching device being coupled to the switch for actuation by actuation of the switch, the control terminal of the second switching device also coupled to the main current conducting paths of the first and second switching devices through first and second voltage dropping elements, respectively, the first switching device including a first field effect transistor (FET), the main current conducting path of which includes the first FET's drain and source terminals, and the control terminal of which is the first FET's gate terminal, the second switching device including a second FET, the main current conducting path of which includes the second FET's drain and source terminals, and the control terminal of which is the second FET's gate terminal, the second voltage dropping element including a second voltage dropping element resistor, the gate of the second FET being coupled through the second voltage dropping element resistor to one of the source and drain of the first FET, the main current conducting path of the first FET being coupled to a first terminal of the switch, a second terminal of the switch being coupled to the gate of the second FET.

8. The self-power down circuit of claim 7 wherein the main current conducting path of the first FET is coupled through the first voltage dropping element to the first terminal of the switch.

9. The self-power down circuit of claim 7 wherein the port is coupled through a software switch, a voltage regulator and the source and drain of the second FET to the battery.

10. The self-power down circuit of claim 8 wherein the port is coupled through a software switch, a voltage regulator and the source and drain of the second FET to the battery.

11. The self-power down circuit of claim 1, 2, 3, 7, 8, 4, 5, 6, 9, or 10 wherein the port includes a port of one of a microcontroller, microprocessor or microcomputer.

* * * * *